(12) United States Patent
Liu et al.

(10) Patent No.: US 10,467,357 B2
(45) Date of Patent: Nov. 5, 2019

(54) GEOBODY CONTINUITY IN GEOLOGICAL MODELS BASED ON MULTIPLE POINT STATISTICS

(71) Applicant: CONOCOPHILLIPS COMPANY, Houston, TX (US)

(72) Inventors: Yongshe Liu, Houston, TX (US); Lin Ying Hu, Katy, TX (US); Jianbing Wu, Houston, TX (US); Claude Scheepens, Houston, TX (US)

(73) Assignee: CONOCOPHILLIPS COMPANY, Houston, TX (US)

( * ) Notice: Subject to any disclaimer, the term of this patent is extended or adjusted under 35 U.S.C. 154(b) by 569 days.

(21) Appl. No.: 15/204,249

(22) Filed: Jul. 7, 2016

(65) Prior Publication Data

US 2017/0011149 A1    Jan. 12, 2017

Related U.S. Application Data

(60) Provisional application No. 62/190,116, filed on Jul. 8, 2015.

(51) Int. Cl.
| | | |
|---|---|---|
| *G06F 17/50* | (2006.01) | |
| *G01V 99/00* | (2009.01) | |
| *E21B 41/00* | (2006.01) | |
| *E21B 49/00* | (2006.01) | |
| *G06F 17/18* | (2006.01) | |

(52) U.S. Cl.
CPC .......... *G06F 17/5009* (2013.01); *E21B 41/00* (2013.01); *E21B 49/00* (2013.01); *G01V 99/005* (2013.01); *G01V 2210/66* (2013.01); *G06F 17/18* (2013.01)

(58) Field of Classification Search
None
See application file for complete search history.

(56) References Cited

U.S. PATENT DOCUMENTS

| | | |
|---|---|---|
| 7,516,055 B2 | 4/2009 | Strebelle |
| 8,452,580 B2 | 5/2013 | Strebelle |
| 8,666,149 B2 | 3/2014 | Thorne |
| 8,818,780 B2 | 8/2014 | Calvert et al. |

(Continued)

OTHER PUBLICATIONS

Caers, J., Zhang, T., Multiple geostatistics: a quantitative vehicle for integrating geologic analogs into multiple reservoi models, Integration of outcrop and modern analogs in reservoir modeling, AAPG Memoir, p. 383-394 (2004).

(Continued)

*Primary Examiner* — Kibrom K Gebresilassie
(74) *Attorney, Agent, or Firm* — ConocoPhillips Company

(57) ABSTRACT

The present disclosure describes a method that improves the long-range geobody continuity in Multiple Point Statistical methods, wherein the coarsest multi-grid level cells are simulated in a regular path, and the subsequent level cells are simulated in a random path as usual. The method is general and is applicable to different cases: such as hard data conditioning, soft data conditioning, non-stationarity modeling, 2 or more than 2 types of facies modeling, and 2D and 3D modeling. The method is particularly useful in reservoir modeling, especially for the channelized systems, but can be generally applied to other geological environments.

17 Claims, 14 Drawing Sheets

(56) References Cited

U.S. PATENT DOCUMENTS

| | | | |
|---|---|---|---|
| 2006/0041409 A1* | 2/2006 | Strebelle | G01V 1/30 703/10 |
| 2006/0052938 A1* | 3/2006 | Thorne | G01V 1/30 702/11 |
| 2011/0295510 A1 | 1/2011 | Gulati | |
| 2012/0265512 A1* | 10/2012 | Hu | G01V 99/005 703/10 |
| 2013/0110484 A1 | 5/2013 | Hu et al. | |
| 2013/0262051 A1 | 10/2013 | Plost | |
| 2013/0318141 A1 | 11/2013 | Maucec | |
| 2013/0329986 A1* | 12/2013 | Strebelle | G01V 99/005 382/159 |
| 2014/0037197 A1* | 2/2014 | Thorne | G01V 11/00 382/159 |
| 2014/0114632 A1 | 4/2014 | Wu et al. | |
| 2016/0048933 A1* | 2/2016 | Strebelle | G06Q 50/16 705/7.35 |

OTHER PUBLICATIONS

Daly, C., Higher order models using entropy, Markov random fields and sequential simulation, In Leuanthong, O. and Deutsch, C.V., eds., Geostatistics Banff 2004, p. 215-224 Springer (2005).

Hu L.Y., Chugunova T., Multiple-point geostatistics for modeling subsurface heterogeneity: a comprehensive review. Water Resource Research 44:WI1413n (2008).

Strebelle S., Conditional simulation of complex geological structures using multiple-points statistics. Math Geol. 34(1): 1-21 (2002).

Strebelle S., Remy N., Post-processing of multiple-point geostatistical models to improve reproduction of training patterns, In Leuanthong, O. and Deutsch, C.V., eds., Geostatistics Banff 2004, Springer (2005).

Strebelle S., Multiple-Point Geostatistics: from Theory to Practice, Ninth International Geostatistics Congress, Oslo, Norway Jun. 11-15, 2012.

International Search Report for related case, App. No. PCT/US20161041316, dated Sep. 14, 2016.

* cited by examiner

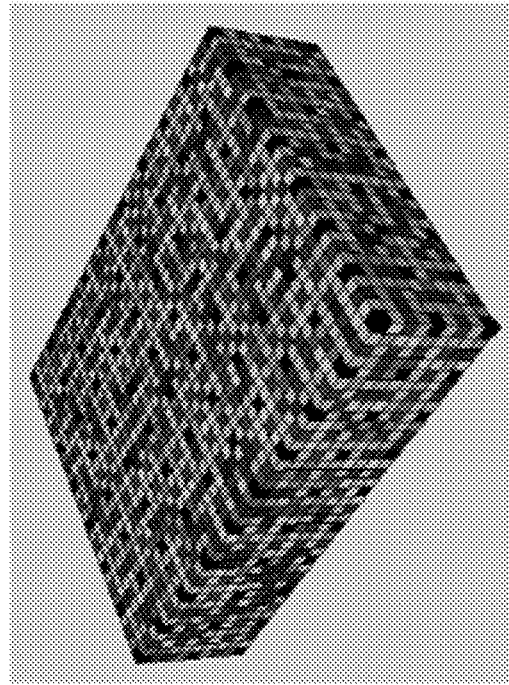
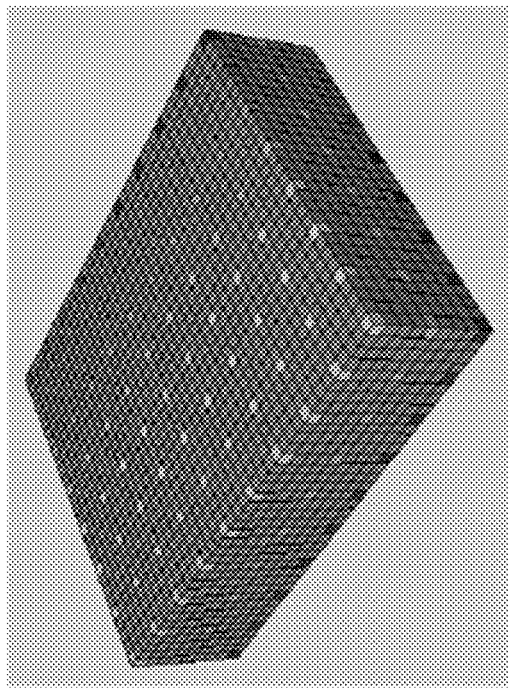
FIGURE 3

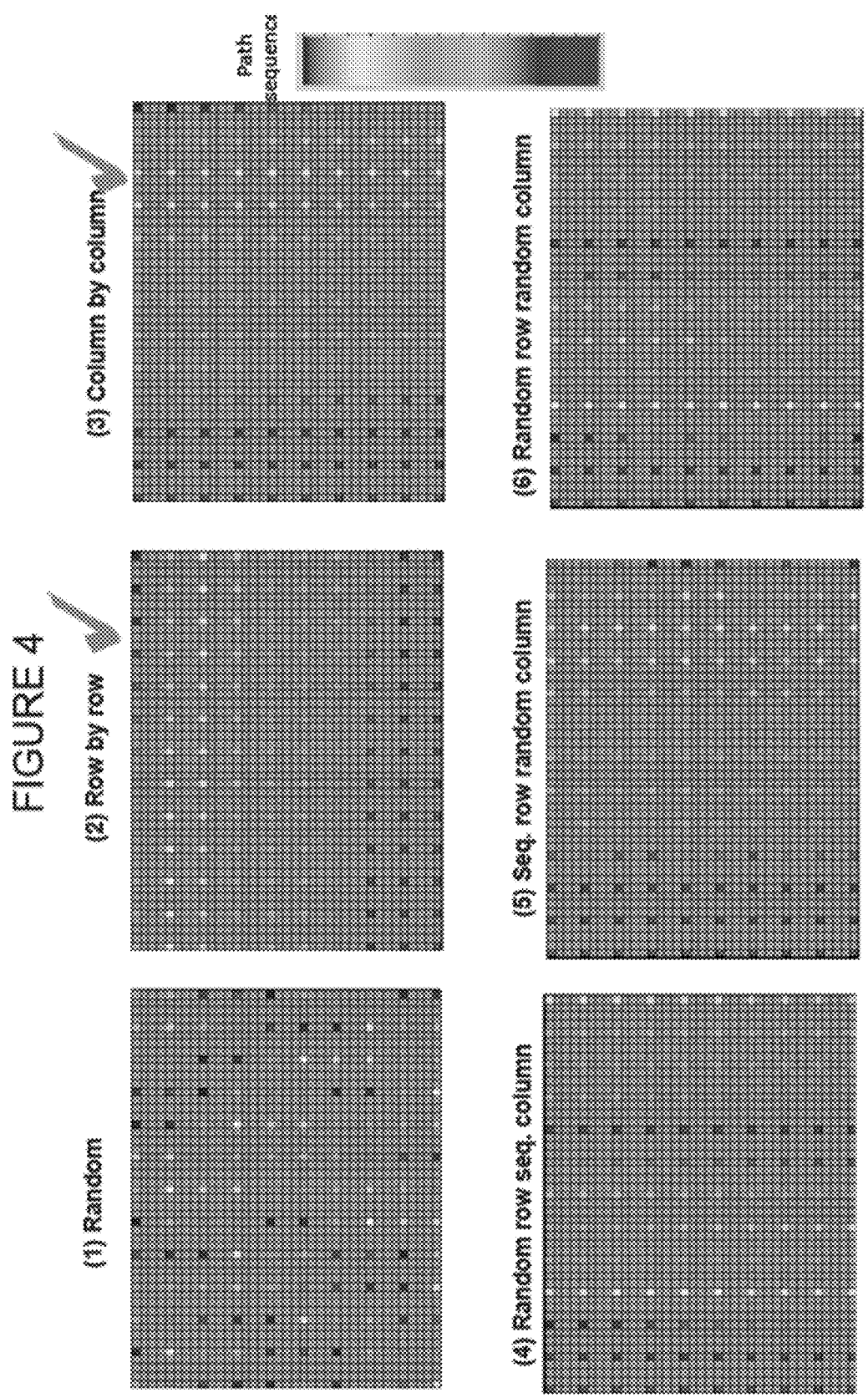

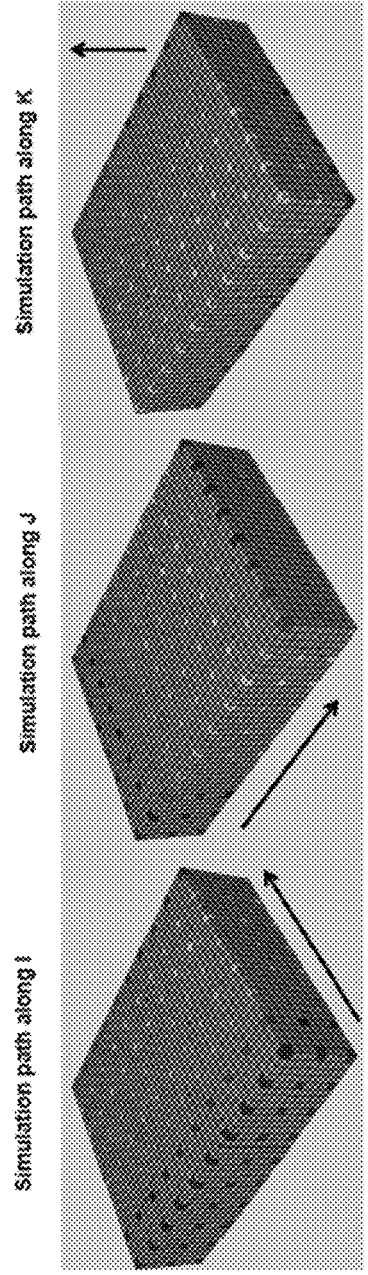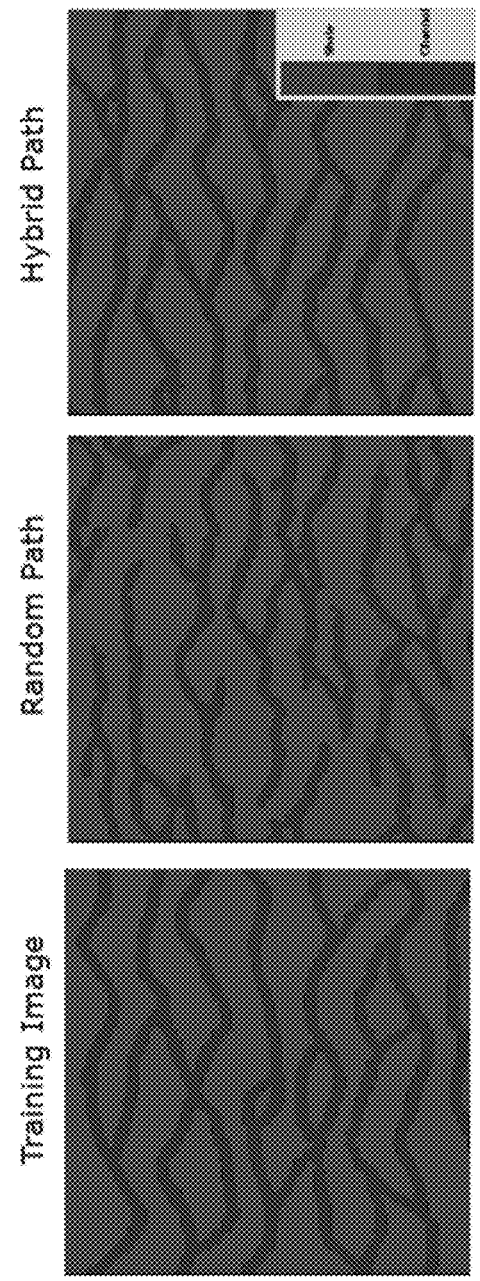

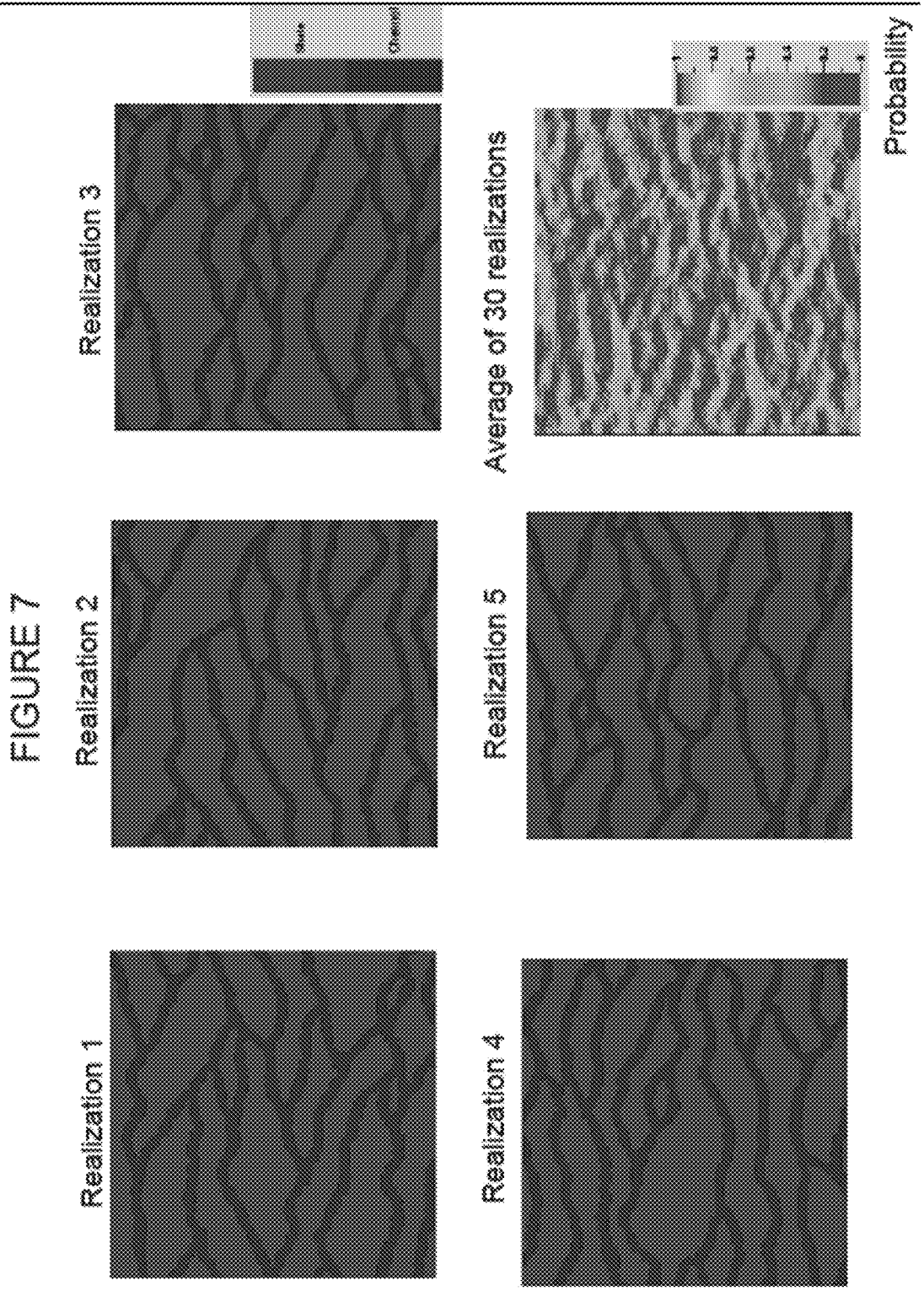

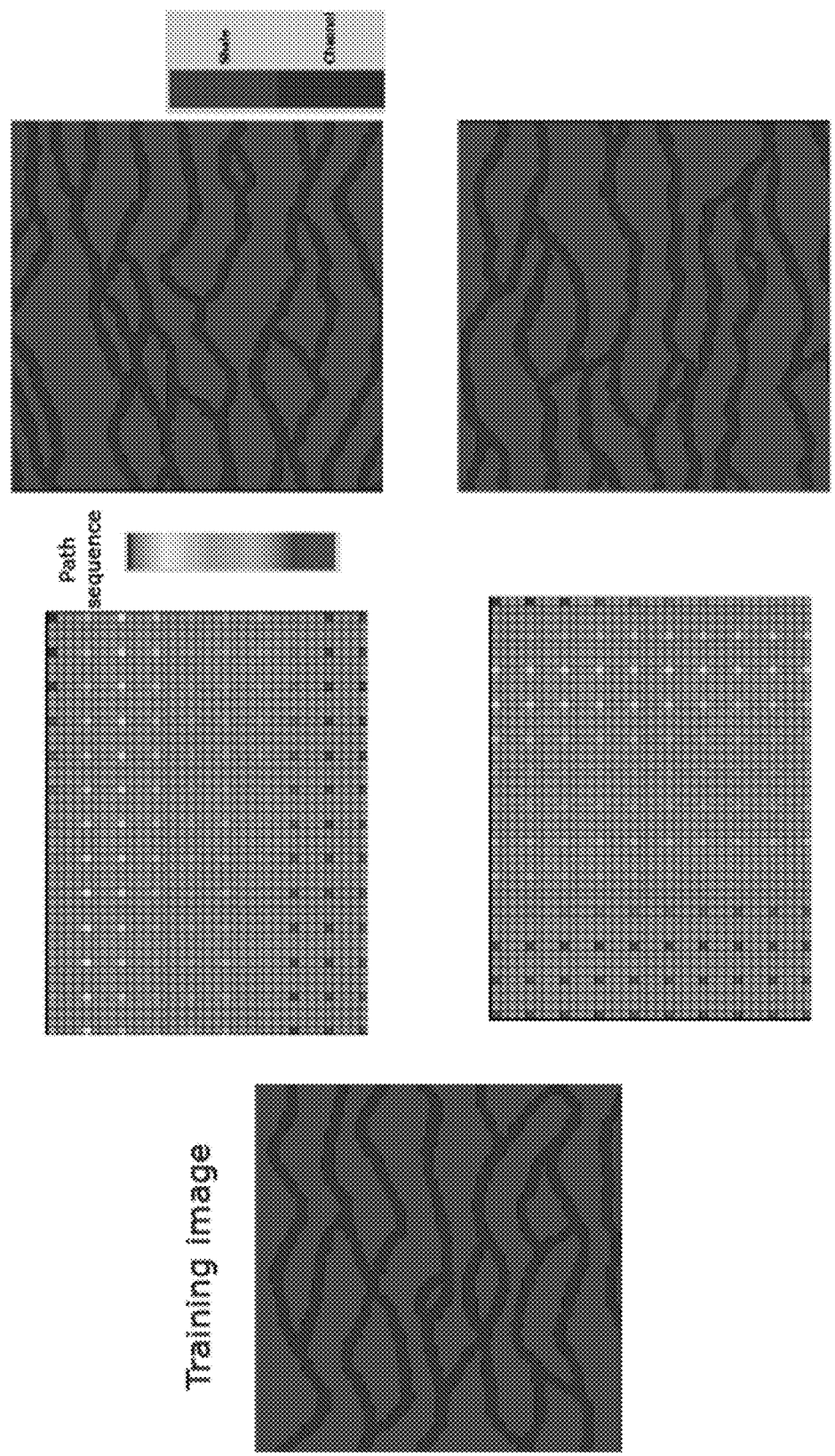

FIGURE 10
Different realizations
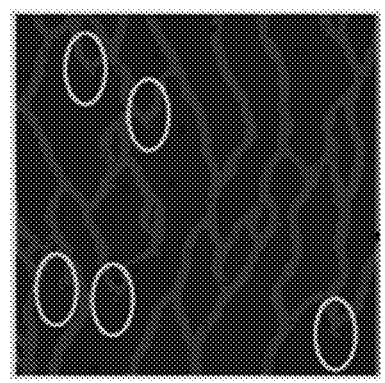
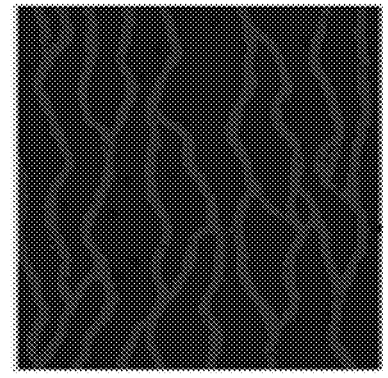
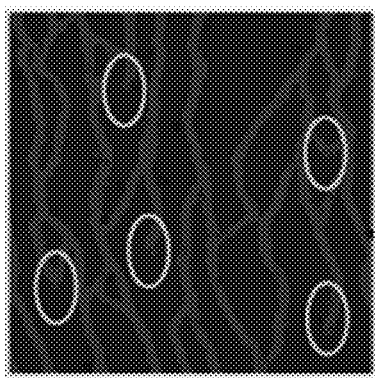
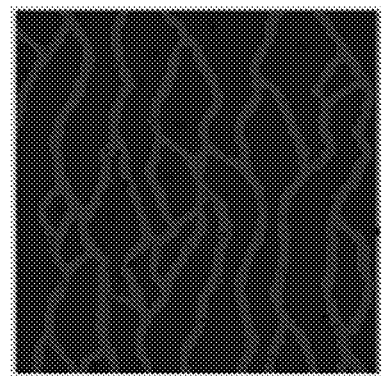
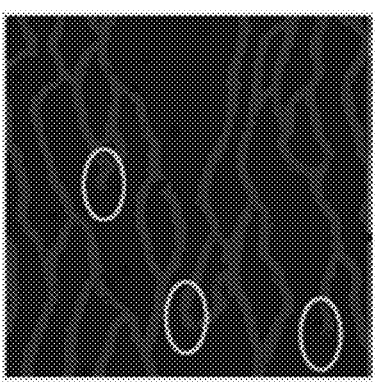
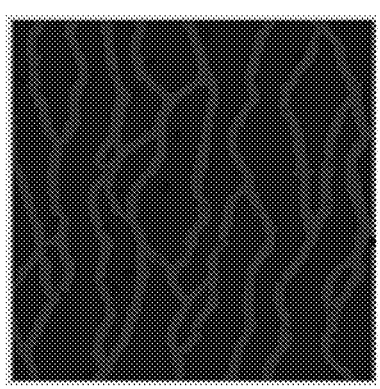
Hybrid path following channel orientation (Has hard data conditioning issue)
Hybrid path perpendicular to channel orientation (hard data are consistently conditioned)

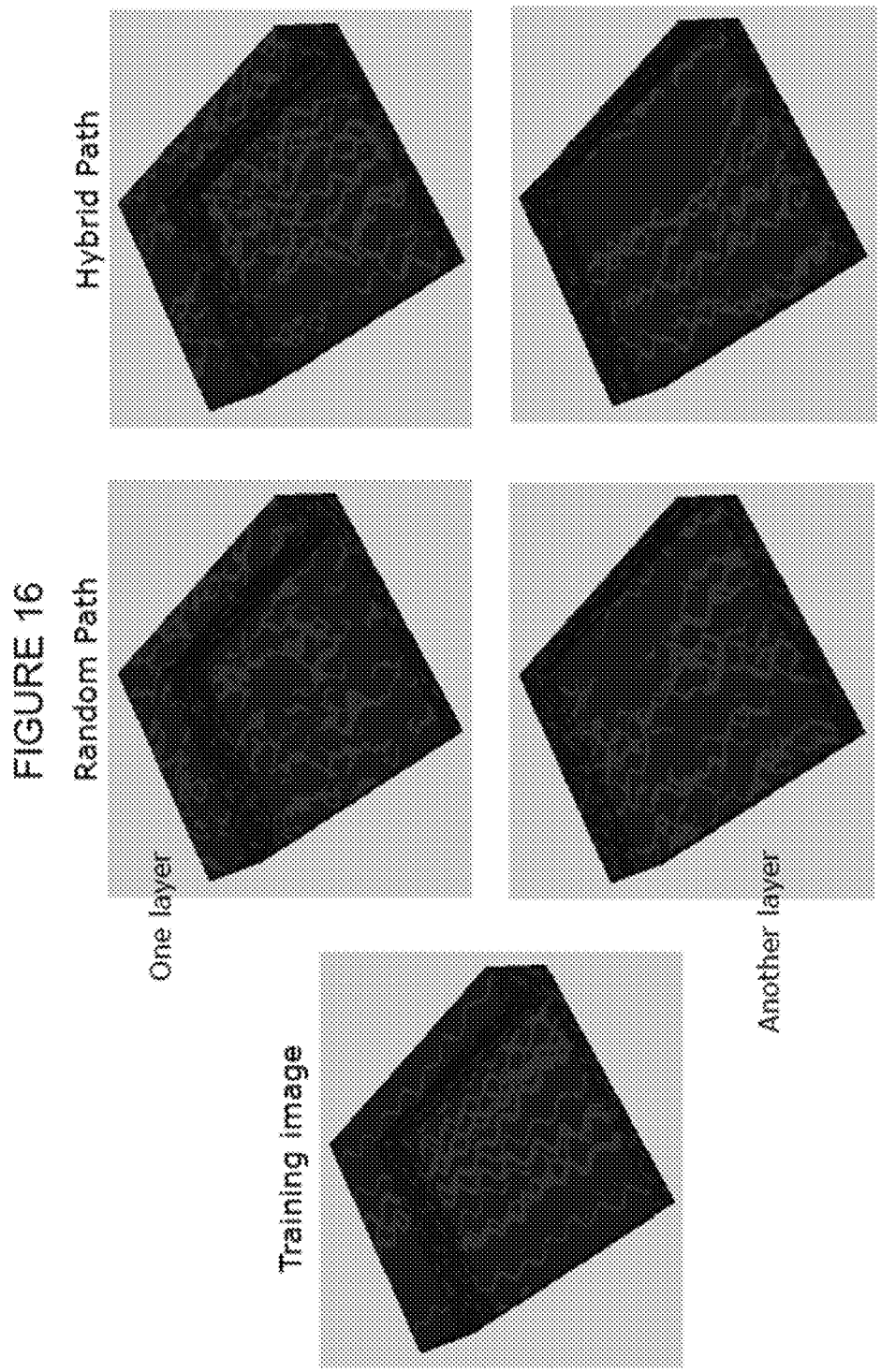

GEOBODY CONTINUITY IN GEOLOGICAL MODELS BASED ON MULTIPLE POINT STATISTICS

PRIOR RELATED APPLICATIONS

This application is a non-provisional application which claims benefit under 35 USC § 119(e) to U.S. Provisional Application Ser. No. 62/190,116 filed Jul. 8, 2015, entitled "IMPROVED GEOBODY CONTINUITY IN GEOLOGICAL MODELS BASED ON MULTIPLE POINT STATISTICS," which is incorporated herein in its entirety.

FIELD OF THE DISCLOSURE

The disclosure generally relates to improved geobody continuity and hard data conditioning in Multiple Point Statistics (MPS) simulation.

BACKGROUND OF THE DISCLOSURE

Modeling subsurface heterogeneity is of crucial importance for the exploitation of subsurface resources and for the geological storage of nuclear wastes, $CO_2$, etc. For more than half a century, geostatistics has been developed for this purpose and widely used in practice.

Geostatistics is the branch of statistics focusing on spatial or spatiotemporal datasets. Developed originally to predict probability distributions of ore grades for mining operations, it is currently applied in diverse disciplines including petroleum geology, hydrogeology, hydrology, meteorology, oceanography, geochemistry, geometallurgy, geography, forestry, environmental control, landscape ecology, soil science, and agriculture—especially in precision farming.

Geostatistics has gained popularity as a quantitative tool to generate multiple geological models, or "realizations," that honor a given statistical structure and various types of measured and interpreted data. Two key approaches have traditionally been followed: a pixel based approach such as sequential indicator simulation based on variograms, and an object based (Boolean) approach in which large objects representing geobodies are inserted into the geological model. Both of these approaches are widely used, but have limitations in terms of reproducing realistic geobody shapes and conditioning to multiple types of data.

Multiple-point statistics (MPS) simulation is a more advanced spatial modeling technique because of its ability to reproduce complex geological patterns (e.g. sinuous channels) that cannot be modeled by two-point statistics (i.e., variograms). Unlike traditional geostatistics, MPS avoids the explicit definition of a random function, but directly infers the necessary multivariate distributions from "training images" or "TI". This confers on MPS a potential applicability to any geological environment, provided that there is a training image representative of the geological heterogeneity and that the essential features of this training image can be characterized by statistics defined through a search template with a limited point configuration. The MPS approach appears flexible to data conditioning and to representing complex architectures of geological facies or petrophysical properties.

The goal of MPS approaches is to enable the ability to reproduce the geological "shapes" as object-based techniques do and maintain the data-conditioning flexibility as variogram-based techniques do. To achieve that, MPS needs to infer and reproduce multiple-point statistics way beyond the traditional two-point statistics (variogram). Because the available data are usually too sparse to infer such high-order statistics, Guardiano and Srivastava proposed the use of a training image, i.e. a three-dimensional numerical conceptual representation of the facies thought to be present in the reservoir to be modeled. The MPS simulation implementation is similar to Sequential Indicator Simulation, where the variogram is replaced with a training image, and Kriging is replaced with the following process to estimate local conditional facies probabilities:

1. Look for the n conditioning data (original well data or previously simulated values) closest to the grid node u to be simulated. These conditioning data form a data event $d_n$ that is fully characterized by its geometrical configuration (the data locations relative to u), and its data values (the facies at the data locations).

2. Scan the training image to find all replicates of $d_n$ (same geometric configuration and same data values as $d_n$). For each replicate, record the facies value at the central location of the training replicate. By "central location," what is meant is the grid node corresponding to the same relative location as u in the data event $d_n$.

3. The estimated conditional probability of each facies at u is computed as the proportion of $d_n$ replicates that have this facies at their central locations.

One major advantage of this implementation is that, as in any pixel-based sequential simulation method, in contrast to object-based methods, well data are honored exactly. In addition, by capturing multiple-point statistics from the training image through the estimation of facies probabilities conditional to multiple-point data events, the MPS model reproduces training image patterns. However, the repetitive scanning of the training image to estimate facies probabilities is very time-consuming.

To help solve this issue, Strebelle introduced a dynamic data structure named "search tree" to store, prior to the simulation, all the conditional probability distributions that could be inferred from the training image. He also used a multiple-grid simulation approach that consists in simulating increasingly finer nested grids to capture training image patterns at various scales. In this multiple-grid approach, the conditioning data search neighborhood is defined by a template that only consists of nodes from the nested grid currently simulated. One search tree is built per data template, or per level of nested multiple grids.

The introduction of the search tree was the technical breakthrough that made SNESIM—a program developed by Strebelle—the first practical implementation of MPS simulation. Further progress was made a few years ago to improve MPS simulation time by reducing the size of the data template used to store the multi-point statistics in the search tree. The search template was designed such that it mostly consists of data locations corresponding to previously simulated nodes, i.e. nodes belonging to grids coarser than the grid currently simulated. Also, intermediary sub-grids were added to the traditional multiple-grid simulation approach to increase the relative proportion of previously simulated nodes in each nested grid.

These SNESIM implementation enhancements not only allowed users to reduce MPS simulation time, but also helped alleviate memory demand to build search trees. Alternative implementations of MPS simulation were proposed to tackle memory demand issues by classifying training patterns into a limited number of representative clusters, e.g., SIMPAT or FILTERSIM, but those solutions were found at the expense of increased simulation time and data conditioning issues.

The definition of the search template thus plays an important part for MPS simulations. It contains the maximum allowable conditioning data when simulating a cell. In theory, the larger the search template, the better the reproduction of the geometric features of the training image. But in practice, the size of the search template is limited by the CPU and RAM costs, and also by the size of the training image. For a given TI, a large search template may result in few replicates of patterns of that template size, and this leads to non-representative statistics. However, a small search template size will not be able to capture long-range patterns of the TI.

The use of multiple grids allows one to use a smaller size search template to save CPU time and at the same time to reproduce long-range patterns. The idea is to start the simulation on the cells at the coarsest level of the multiple grids and to finish it on the cells at the finest level of multiple grids. The search template geometry is defined once for all grids, but rescaled to each multiple grid level and a search tree is built for each multiple grid level.

The use of multiple grids is recommended, but a very large number of multiple grids will not necessarily improve the reproduction of long-range patterns because of the limited TI size that resulting in a limited number of data event replicates.

Thus, the ability to model long range patterns continues to present issues in fully realizing the benefits of MPS simulation.

Therefore, there is a need for improving MPS methods to capture long-range patterns or continuities without the concomitant enormous CPU and RAM costs.

SUMMARY OF THE DISCLOSURE

A novel regular-random hybrid simulation path is proposed to improve geobody continuity and hard data conditioning in Multiple Point Statistics simulation. The method uses an anisotropy-specific regular path on the coarsest level of multiple grids to better capture the large-scale continuity and uses a random path at the lower levels of multiple grids to explore more uncertain variability in stochastic simulation.

Usually, MPS simulation is performed sequentially cell by cell following a random path. Consider that all data points are located on the simulation grid. Otherwise, they are relocated to their respective nearest grid cells. We can define a search template with certain data configuration constituted by n nodes ($u_0$, $u_1$, $u_2$, $u_n$), where $u_0$ is the central node, $u_1=u_0+h_1$, $u_2=u_0+h_2$, $u_n=u_0+h_n$, and $h_i$ is the separate distance between $u_i$ and $u_0$ Then, scan the TI with the search template for identifying all the replicates of the data event {$Z(u_0+h_1)=z_1$, $Z(u_0+h_2)=z_2$, ..., $Z(u_0+h_n)=z_n$} in the TI. For each training replicate of the data event, we read the value at location $u_0$.

The ensemble of these values allows us to build a local distribution of $Z(u)$ conditioned to the data event {$Z(u_0+h_1)=z_1$, $Z(u_0+h_2)=z_2$, ..., $Z(u_0+h_n)=z_n$}. From this local distribution, a value of $z(u_0)$ is drawn and assigned to the corresponding grid cell, and then the simulation is moved to the next randomly selected cell on the simulation grid. This process is repeated until the all grid cells are filled.

In contrast, we have used a regular path—unilateral regular or bilateral regular path—for the cells at the coarsest level of the multiple grids, and used the typical random path for the cells at the rest of the multiple grid levels.

We have proven herein that in the unconditional simulation case, the simulated geobodies have equally improved continuity no matter whether the lateral regular path on the coarsest grid follows a horizontal I or J lateral direction and no matter what the major continuity direction of the geobodies is.

We also solved the hard data conditioning issue of the regular path by making the regular path follow the minor geobody continuity direction.

In the vertical direction of a 3D model, we proposed to reduce the number of multi-grid levels and use the regular path at the coarsest level of the multiple grids to achieve better geobody continuity.

The invention includes and one or more of the following embodiments, in any combination(s) thereof:

A method for modeling a subsurface reservoir, the method comprising:
building a grid model corresponding to said subsurface reservoir;
defining multiple grids on the said grid model;
obtaining a training image representative of geological patterns of a subsurface reservoir;
extracting all conditional probability distributions that can be inferred from said training image at different multi-grid levels;
storing all conditional probability distributions in search trees;
applying MPS simulation on the cells at the coarsest multiple grid level wherein a regular path from cell to cell is followed;
applying MPS simulation on the cells at the intermediate and the finest levels of the multiple grids wherein a random path from cell to cell is followed until all cells are simulated; and
completing a facies model of said subsurface reservoir once all cells are simulated.
A modeling method as herein described wherein said grid has a horizontal I axis and a horizontal J axis perpendicular to said I axis and a vertical K axis, and wherein applying step g proceeds unidirectionally across said grid in said I or J axis direction and sequentially in said K axis.
A modeling method as herein described wherein said grid has a horizontal I axis and a horizontal J axis and a vertical K axis, and wherein applying step g proceeds bidirectionally (back and forth) across said grid in said I or J axis direction and sequentially in said K axis.
A modeling method as herein described wherein said regular simulation path is a unilateral regular pathway.
A modeling method as herein described wherein said regular simulation path is a bilateral regular pathway.
A modeling method as herein described wherein said training image is one or more 2D training images.
A modeling method as herein described wherein said training image is one or more 3D training images.
A modeling method as herein described wherein said training image is one or more 2D training images and one or more 3D training images.
A modeling method as herein described wherein training images are a conceptual representation of said subsurface reservoir.
A modeling method as herein described wherein training images are constructed using unconditional simulation.
A modeling method as herein described wherein said facies model is a 2D facies model.
A modeling method as herein described wherein said facies model is a 3D facies model.
A modeling method as herein described wherein said facies model is two or more facies model.
A modeling method as herein described wherein said subsurface reservoir is stationary.
A modeling method as herein described wherein said subsurface reservoir is non-stationary cases with multiple regions or soft trend constraints.
An improved method of multiple point statistic (MPS) modeling, wherein said MPS modeling uses a multiple grid levels comprising a coarsest level, intermediate level(s), and a finest level and MPS simulations are performed in a random path at all grids levels beginning with the coarsest multi-grid level grid, then intermediate level grid, and then finest level grid, the improvement comprising performing MPS simulations in a regular path at the coarsest multi-grid level, then performing MPS simulations in a random path at the intermediate level, and then performing MPS simulations in a random path at the finest level.
A modeling method as herein described wherein said regular path is a unilateral regular pathway.
A modeling method as herein described wherein said regular path is a bilateral regular pathway.
A modeling method as herein described wherein for unconditional simulation, using the regular path along either I or J direction gives equally improved channel continuity regardless of the geobody major continuity direction.
A modeling method as herein described wherein for the hard data conditioning cases, using the regular path perpendicular to the major geobody continuity direction resolves artifacts around the hard data locations in the MPS models.
A modeling method as herein described which is computer implemented.
A modeling method as herein described wherein the resulting model can be used for a variety of purposes, including reservoir characterization, reservoir performance analysis, uncertainty assessment, infill drilling opportunity and production optimization.

By "Multiple Point Statistics" what is meant is an alternate approach to two-point geostatistical methods that uses a training image instead of a variogram to estimate the conditional probability at the simulation location given the observed data and the previously simulated values.

A "search template" is defined by vectors radiating from a central node. The template is constituted by certain number of nodes. That template is used to scan the training image and record all training patterns.

By "grid," what is meant herein is a discretization of a 3D space into a grid like pattern, such that the space can be simulated from cell to cell. Grid level refers to the spacing between the grid levels, thus a multi-grid level of 3 refers to a spacing of three cells in a single level, whereas a multi-grid level of 1 means that every cell starts a new grid level in that axis.

The simulation grid shape is typically "square" (e.g., with equidistance nodes), however, we can also use rectangular grid cells, where the grid size is reduced in one direction. Like other geostatistical algorithms, the MPS simulation is performed on the Cartesian grid.

By "coarsest" grid what is meant is the highest level of grid cells in the multiple grid system (e.g., the grid cells are the largest).

By "intermediate" grid, what is meant is the intermediate level(s) of grid cells in the multiple grid system.

By "finest" grid, what is meant is the lowest level of grid cells in the multiple grid system (e.g., the grid cells are the smallest).

Multiple levels of multiple grids can be used, but three or four is typical.

By "regular-random hybrid" or "hybrid" path, what is meant is that the simulation path at the coarsest level of the multiple grids is in a regular order, and that at the intermediate and the finest grid level is in a random order.

By "stationarity" what is meant is the condition in which the data do not exhibit any trend. This implies that a moving-window average shows homogeneity in the mean and variance over the area of interest. As an example, the stationarity of a MPS facies model implies the facies proportions, geobody size and orientations remains statistically similar in the simulation region or the entire model.

By "regular" path what is meant is that the grid cells are simulated are in a predictable pattern. See e.g., FIG. 4 for examples. Contrast "random" pathway where the position of the last simulation grid cell does not predict the next cell to be simulated, e.g., the pathway is haphazard, without direction or pattern.

By "unilateral regular" path what is meant is that the grids are simulated row-by-row or column-by-column or on the diagonal in a single direction. See e.g., FIGS. 4.2 and 4.3.

By "bilateral regular" path what is meant is that the grids are simulated row-by-row or column-by-column or on the diagonal in a back-and-forth or two directional manner.

The use of the word "a" or "an" when used in conjunction with the term "comprising" in the claims or the specification means one or more than one, unless the context dictates otherwise.

The term "about" means the stated value plus or minus the margin of error of measurement or plus or minus 10% if no method of measurement is indicated.

The use of the term "or" in the claims is used to mean "and/or" unless explicitly indicated to refer to alternatives only or if the alternatives are mutually exclusive.

The terms "comprise", "have", "include" and "contain" (and their variants) are open-ended linking verbs and allow the addition of other elements when used in a claim.

The phrase "consisting of" is closed, and excludes all additional elements.

The phrase "consisting essentially of" excludes additional material elements, but allows the inclusions of non-material elements that do not substantially change the nature of the invention.

The following abbreviations are used herein:

| ABBREVIATION | TERM |
| --- | --- |
| MPS | Multiple Point statistics |
| SNESIM | Single Normal Equation Simulation |
| FILTERSIM | Filter-based Simulation |
| SIMPAT | Simulation with Patterns |

BRIEF DESCRIPTION OF THE DRAWINGS

FIG. 3 shows the inventive concept of proceeding in a regular simulation path at the coarsest level of the multiple grids, then randomly through the remaining grid cells. This is named as a "regular-random hybrid" or just "hybrid" approach herein. The color scales are as in FIG. 1 for this figure and throughout, unless indicated otherwise. The coarsest grid cells in the right figure are color coded in black to highlight their locations.

FIG. 4 shows a variety of simulation path schemes that can be employed at the coarsest grid level, wherein row by row and/or column by column are preferred herein. A random pattern is also provided (top left) for contrast.

FIG. 5 shows a regular simulation path along the 3 axes, wherein axis K reflects the vertical direction.

FIG. 6 shows the effect of using a regular-random hybrid pattern on the model results. The use of the hybrid path produces fewer blind ends and provides better continuity in the resulting model.

FIG. 7 shows multiple realizations using the hybrid simulation path. The final panel is the average of 30 facies realizations, i.e. the probability of channel facies, wherein the color represents the probability of channel facies occurrence in the 30 realizations.

FIG. 8 compares the effect of the realizations using a row-by-row (top) and column-by-column (bottom) regular path, indicating that proceeding along the I or J axes is equally effective for unconditional simulations.

FIG. 10 is similar to FIG. 9, but showing more hard data conditioning examples from different realizations. In the top row, the regular simulation path follows channel orientation, whereas in the bottom row the regular path is perpendicular to the channel orientation (bottom).

FIG. 16 shows the use of the hybrid path to generate 3D realizations from 3D training images. It demonstrates the improved channel continuity in the 3D modeling cases.

DETAILED DESCRIPTION

The MPS facies modeling method proposed by Strebelle is increasingly gaining attention in the petroleum geological modeling community. MPS models reproduce the geological patterns and also are flexible in data conditioning since they are based on a pixel-based algorithm. One issue of the current MPS algorithm, however, is that the long range or larger scale sinuous geobody (e.g. fluvial channel) continuity cannot be accurately reproduced. Discontinued channels are generated in MPS models even though they do not exist in the training image. The resulting blind end channels will negatively impact predictions of reservoir connectivity and reservoir flow performance.

To reproduce the large scale pattern continuity, Daly and Hu proposed to use a unilateral path on all grid cells. This method improved channel continuity, but reduced uncertainty ranges resulting from deterministic path and also it could not accurately condition model realizations to hard data.

As another possible solution, Strebelle and Remy proposed a re-simulating method. They identified the nodes simulated with a limited conditioning data and re-simulated them. This method required several iterations of re-simulation to complete a realization. Thus, it consumed more CPU time.

We propose a novel approach herein to address the long geobody continuity reproduction problem in MPS. This disclosure addresses the geobody continuity and hard data conditioning issues from one or more of the following aspects:

1. The regular path is used on the cells at the coarsest level of the multiple grid system and the random path is used on the rest of cells. This method significantly improves geobody continuity in MPS facies simulation. A unilateral or bilateral regular simulation path can be used, or the path can be regular in one axis and random in others, but this may be less preferred.

2. In the lateral direction, the regular unilateral path can follow I or J direction, and it has been proven that they produce equally much improved geobody continuity for unconditional simulations.

3. In the vertical direction, an improved vertical continuity can be achieved by reducing multiple grid level in the vertical axis; hence it increases the number of cells (along that axis) using the regular path since the regular path is only applied to the cells at the coarsest level of multiple grids and in the vertical direction there are now more cells.

4. Using the regular path following the minor geobody continuity direction resolves the hard data conditioning issue related to the regular simulation path.

5. We demonstrated the claimed method works for modeling 2D and 3D cases, modeling non-stationarity and modeling the geobodies with various major continuity directions.

The disclosure thus helps to build more geologically realistic facies model, which can provide better guidance in drilling new wells and production optimization.

Figure 1:
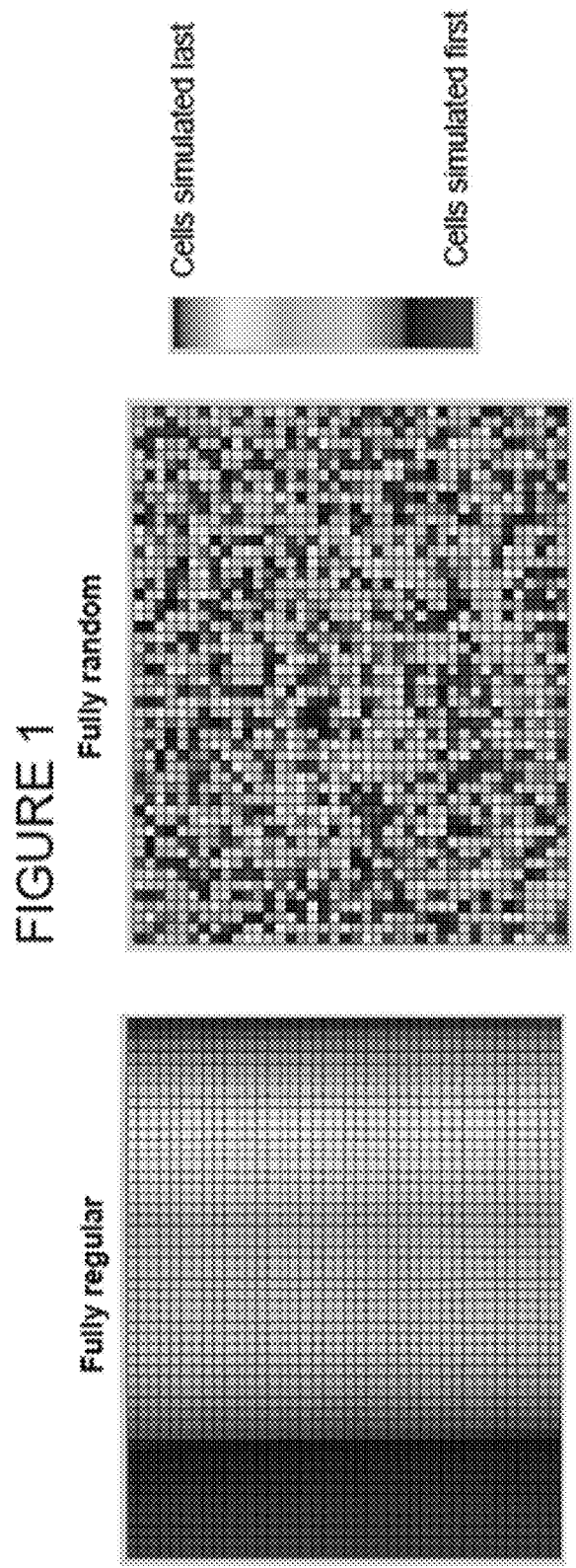
FIG. 1 illustrates the simulation paths that result from proceeding from grid cell to cell using a fully regular path (left) and a fully random (right) path.

In geostatistical simulation algorithms, the random simulation path is typically used. See FIG. 1 illustrating a random path (right) and a unilateral regular path (left). Fully regular path is not used because 1) it will reduce the uncertainty variations; 2) an error introduced at the early stage of the simulation path will be propagated to the subsequent cells in the model.

Figure 2:
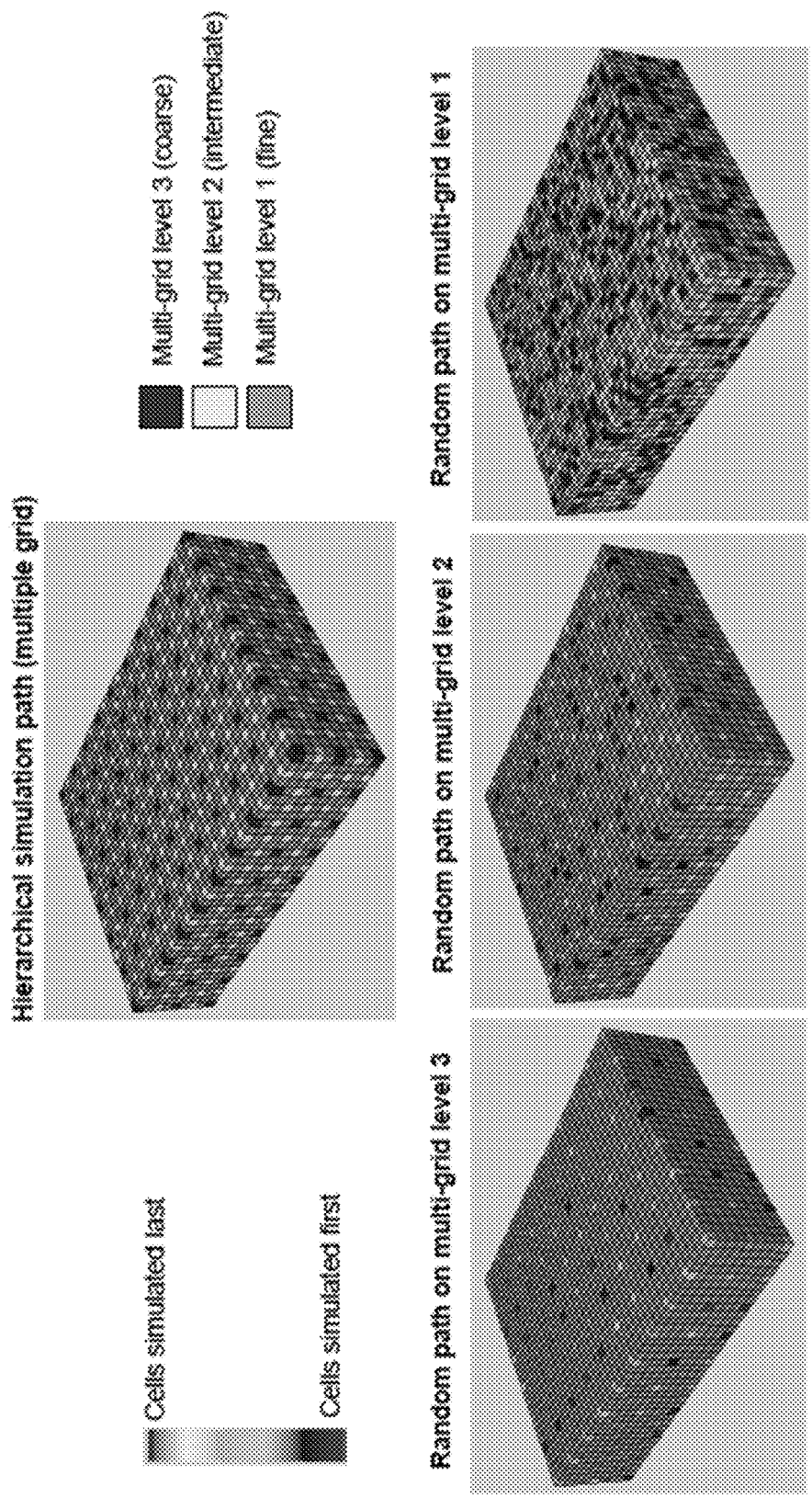
FIG. 2 illustrates the concept of multiple grids (coarse in red, intermediate in yellow and fine in grey) in the top figure and of proceeding hierarchically through the grid levels in random sequence in the bottom three figures. For example, the red coarse grid cells in the top figure are randomly visited first before the yellow and grey cells in the lower levels of the multiple grids are visited.

In geostatistical simulation algorithms, multiple grid schemes are usually used, as shown in FIG. 2. Red cells are at the coarsest multiple grid level (multiple grid level 3), yellow cells are at the intermediate multiple grid level (multiple grid level 2) and grey ones are at the finest multiple grid level (multiple grid level 1). Normally, the stochastic simulation is performed first at the coarsest level and then move to the cells at the next level of the multiple grids. At each grid level, the cells are simulated one by one in a random sequence.

Instead of the random simulation sequence, in this disclosure we used a regular unilateral path on the coarsest multi-grid and used a random path for the rest of multi-grid levels. This is referred to as a "regular-random-hybrid path" or just "hybrid path" herein. The intention is to capture the large scale continuity at the highest level of the multiple grids, in the meantime to maintain the uncertainty assessment capability on the lower level multi-grid cells.

Although the work presented herein used a regular unilateral path, such as in FIG. 4.2 or 4.3, there are many different ways of defining a regular lateral path for the coarsest grid. See e.g., FIG. 4 showing a random path, along with a variety of regular paths, including unilateral regular row-by-row, column-by-column, and partially regular patterns including random rows, random columns, and random row within a random column.

Although not shown in FIG. 4, one can also travel back and forth across the grid, rather than traversing to the left side each time a row is initiated. One could also travel up and down, rather than proceeding to the top for each column. Further, one can also travel in a diagonal line across the grid, and the diagonal lines can also go back and forth rather than in a single direction.

FIG. 5 shows regular simulation paths along the three available axes—I, J and K, wherein the I and J axes are along the lateral directions and the K axis follows the vertical direction.

In FIG. 6, we can see the channel continuity in the training image is very well reproduced in the regular-random-hybrid path case comparing to the typical random path case that has previously been used.

FIG. 7 shows 5 different realizations using a hybrid path and the average map (lower left) of 30 realizations, which gives the probability map of the channel facies. The facies probability map indicates the channel spatial distribution is relatively uniform or stationary, as expected for unconditional simulation without hard or soft data constraint. This map should be uniform with a large number of realizations.

FIG. 8 shows that using the path following I or J direction gives equally improved channel continuity in the unconditional simulation cases. The reason is that the regular path, either along I or J, results in more conditioning data available in the search template, which makes it easier to find pattern replicates from the training image search tree.

Figure 9:
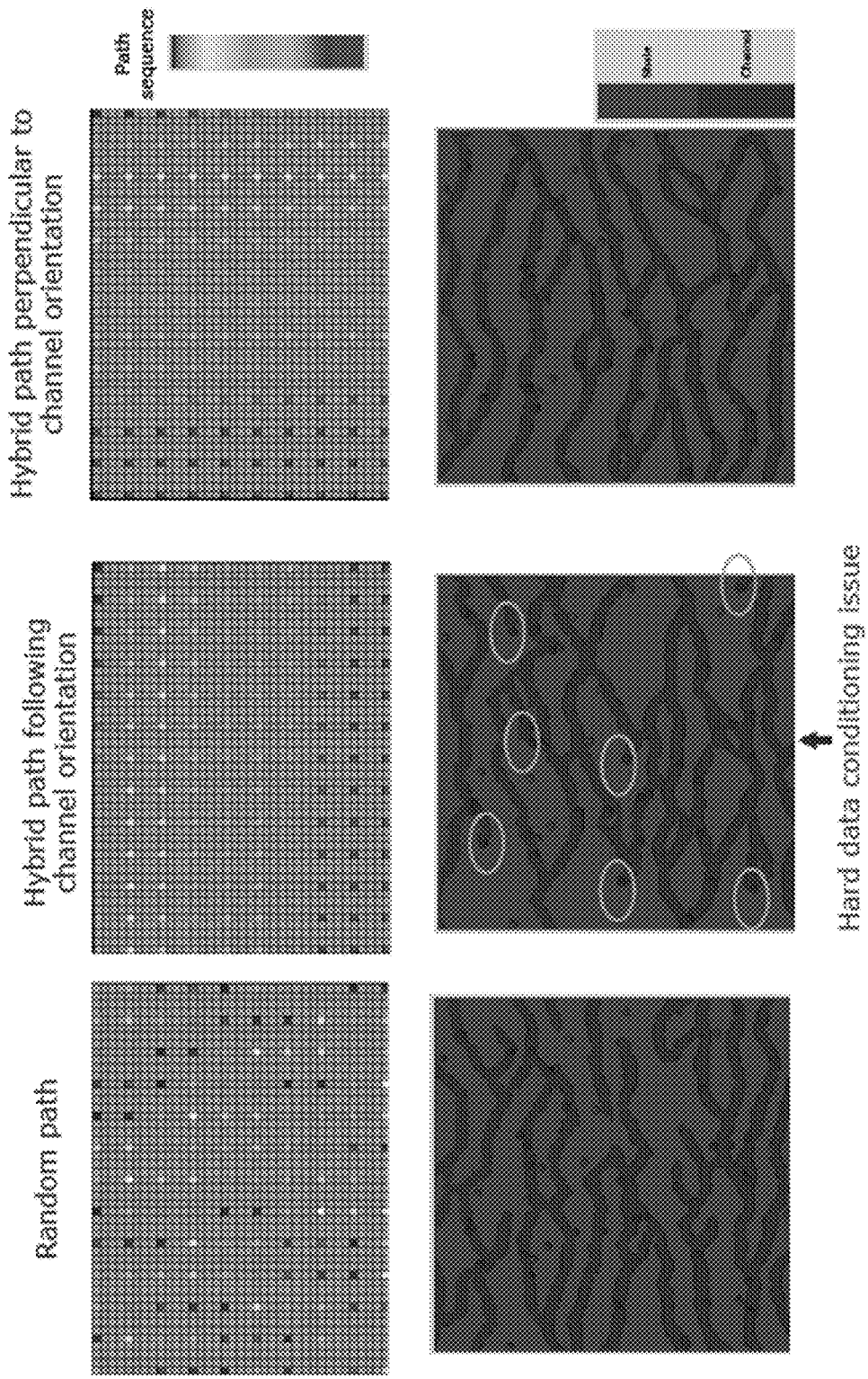
FIG. 9 compares hard data constrained realizations using a fully random simulation path (left) against a hybrid path following the channel orientation (middle) and perpendicular to the channel orientation (right). A blue dot refers to a hard datum with a shale facies value, and a red dot refers to a hard data with a channel facies value. The green ellipses in the middle figure show the problems in hard data conditioning, wherein the channels are unrealistically terminated at the hard data locations. These model artifacts are geologically unrealistic. As can be seen, when the simulation pathway is changed to be perpendicular to the main channel direction, this issue is resolved.

One issue of regular path is that it creates problems in conditioning the hard data (see the green ellipses in FIG. 9). Two factors can cause these problems: 1) the unilateral path moves along a row of cells from one side to the other. It can potentially create conflicts between training image pattern and hard data; 2) the major channel continuity is along axis I (in this example), which increases the chance of conflicts to model the long features if the unilateral regular path follows the I direction.

We proposed that the regular path should therefore be along the minor continuity direction, which is along axis J in this case. We achieved perfect well data conditioning by following the minor continuity direction (perpendicular to channel direction) as well as much better channel continuity. Examples demonstrating this are shown in FIG. 10.

Figure 11:
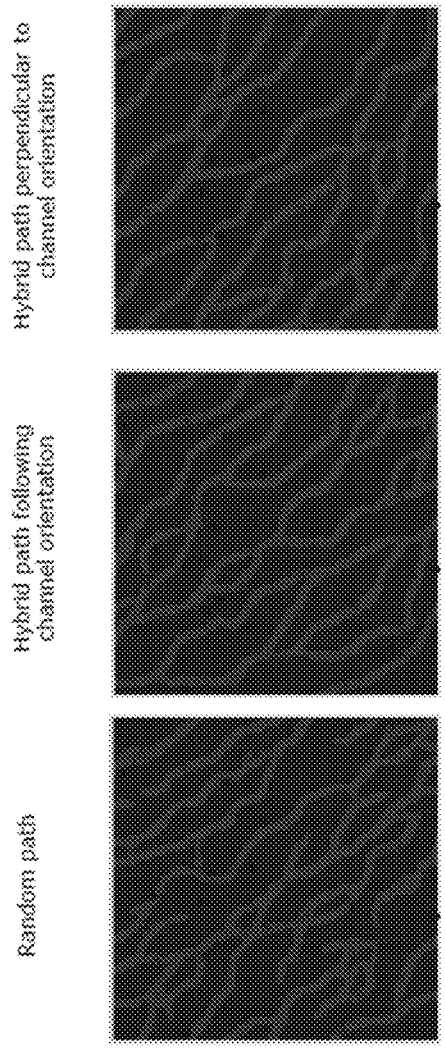
FIG. 11 is similar to FIG. 9, but showing that when the channels are oriented along the 45° direction from I, the two hybrid simulation paths (following I or J) works equally well.

If the channel orientation is not along I or J, but is instead at a 45 degree angle, both I and J regular paths give equally improved channel continuity. See e.g., FIG. 11. However, by employing a diagonal grid pathway, we would still be able to have a pathway perpendicular to the major continuity direction. Although these simulations have not yet been run, we predict it would improve the results in a manner similar to that shown in FIG. 10.

Figure 12:
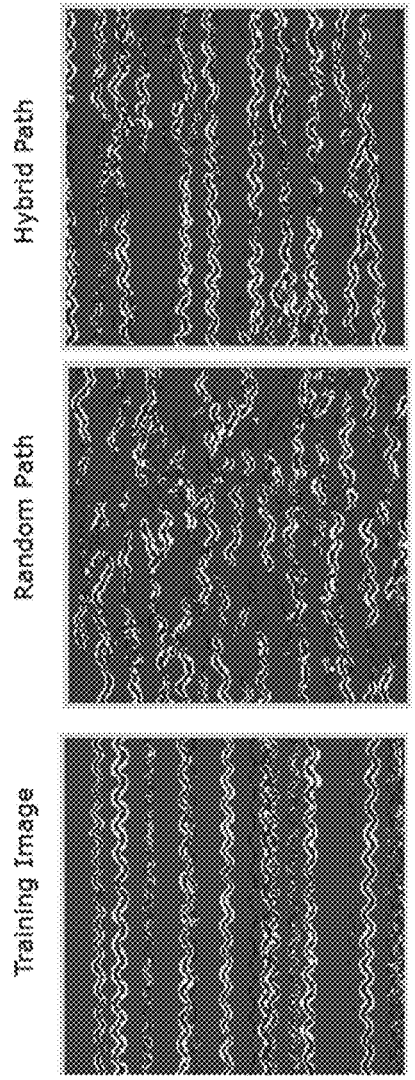
FIG. 12 shows a three facies example, wherein the use of random simulation paths produce a realization with far poorer continuity than the hybrid simulation path does.

FIG. 12 shows a three facies example, wherein the use of a fully random simulation path gives a realization with far poorer continuity than the use of hybrid simulation path does described herein.

Figure 13:
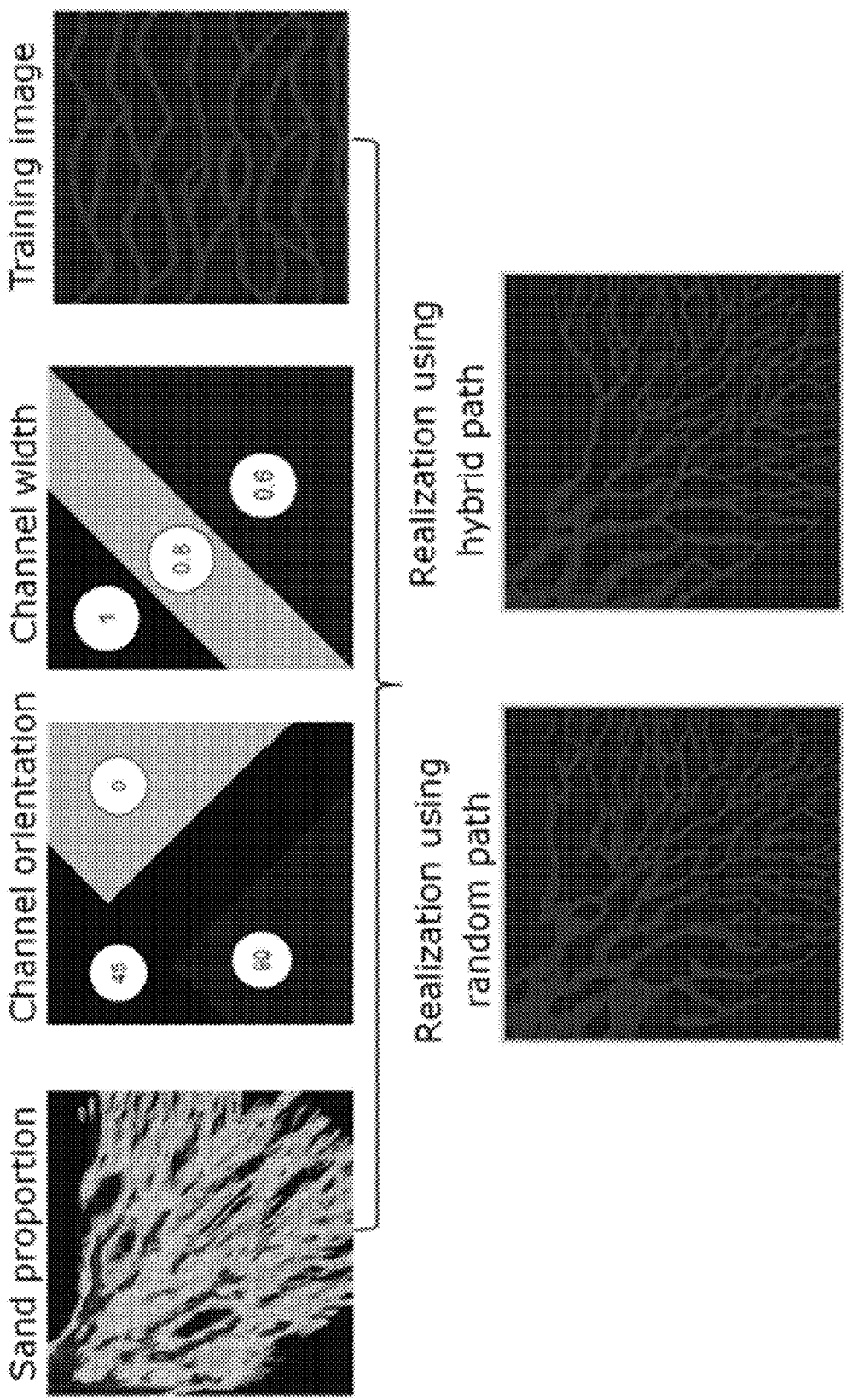
FIG. 13 demonstrates that the method works well for non-stationary cases. In this example, multiple types of conditioning data, such as hard data, sand proportion map and varying channel orientations and widths, are used in addition to the training image. The channel continuity modeled from the hybrid path (the bottom right) is improved as compared to that from the random path (the bottom left).

FIG. 13 shows the applicability of the proposed method to model non-stationary cases. The non-stationarity of a MPS model can be characterized through spatially varying channel sand proportions, orientations and widths. They are integrated with stationary training image to generate facies model realizations (the bottom 2 figures). The hybrid path approach improves the model quality when non-stationary regions exist.

For 3D cases, our studies indicated that we needed to include more cells in the regular path in order to improve the vertical geobody continuity. We proposed to reduce the number of multiple grid levels in the vertical direction, say from 3 to 2 or 1. Reducing the multi-grid level to 2 or 1 increases the numbers of cells in the vertical axis, thus improving continuity.

Figure 14:
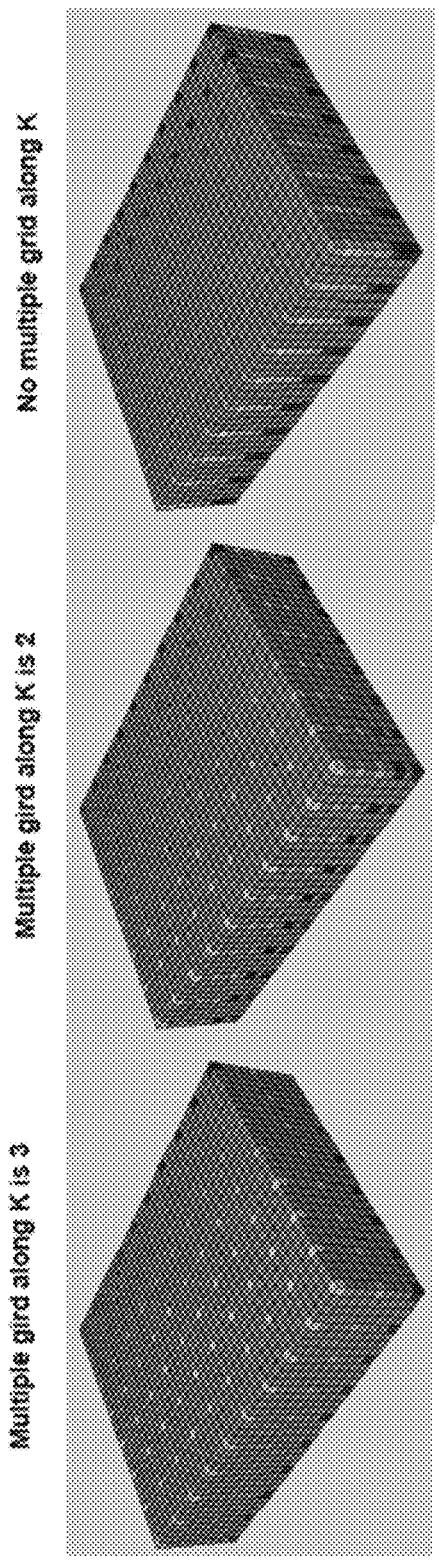
FIG. 14 shows regular path cells with different multi-grid spacing along the K direction. They have different multiple grid levels along K: 3 (left), 2 (middle) and 1 (right).
Figure 15:
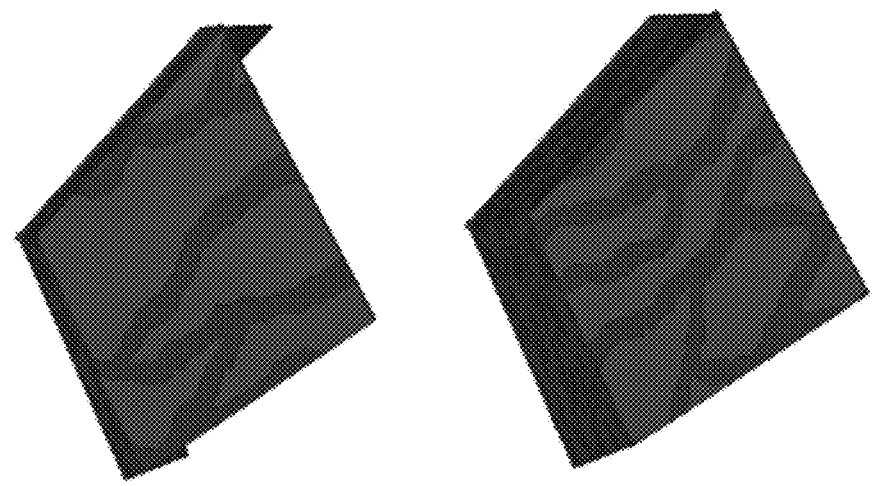
FIG. 15 shows the use of the hybrid path to generate 3D realizations from 2D training images. A 3D MPS model can be generated from a 2D training image in the manner described in e.g., US20140114632. The proposed method improves the channel continuity in this workflow.

In FIG. 14 the colored cells are at the coarsest level of the multiple grids, hence those cells will follow the regular path. The left figure has 3 multiple grid levels along K direction (i.e., there is one cell at the coarsest grid level every 4 cells along K); the middle figure has 2 multiple grid levels along K direction (i.e., there is one cell at the coarsest grid level every 2 cells along K); the right figure has 1 multiple grid level along K direction (every cell along K is at the coarsest grid level). The modeled channel continuity is improved using the proposed method, see FIGS. 15 and 16.

The following references are incorporated by reference in their entirety for all purposes:

Caers, J., Zhang, T., Multiple geostatistics: a quantitative vehicle for integrating geologic analogs into multiple reservoir models, In Grammer, G. M. al, eds, AAPG Memoir "Integration of outcrop and modern analogs in reservoir modeling", (2004).

Daly, C., Higher order models using entropy, Markov random fields and sequential simulation, In Leuanthong, O. and Deutsch, C. V., eds., Geostatistics Banff 2004, Springer (2005).

Hu L. Y., Chugunova T., Multiple-point geostatistics for modeling subsurface heterogeneity: a comprehensive review. Water Resource Research 44:WI1413n (2008).

Strebelle S., Conditional simulation of complex geological structures using multiple-points statistics. Math Geol. 34(1): 1-21 (2002).

Strebelle S., Remy N., Post-processing of multiple-point geostatistical models to improve reproduction of training patterns, In Leuanthong, O. and Deutsch, C. V., eds., Geostatistics Banff 2004, Springer (2005).

Strebelle S., Multiple-point statistics (MPS) simulation with enhanced computational efficiency. (2009)

Strebelle S., Multiple-Point Geostatistics: from Theory to Practice Ninth International Geostatistics Congress, Oslo, Norway Jun. 11-15, 2012

U.S. Pat. No. 7,516,055 Multiple-point statistics (MPS) simulation with enhanced computational efficiency U.S. Pat. No. 8,452,580 Method and system for using multiple-point statistics simulation to model reservoir property trends U.S. Pat. No. 8,666,149 Method for editing a multi-point facies simulation U.S. Pat. No. 8,818,780 Forming a model of a subsurface region US20140114632 Method for modeling a reservoir using 3d multiple-point simulations with 2d training images US20130110484 Reservoir modeling with multiple point statistics from a non-stationary training image

The invention claimed is:

1. A method for modeling a subsurface reservoir, said method comprising:
generating a grid model corresponding to a subsurface reservoir, said grid model having multiple grid levels with cells, said multiple grid levels including a coarsest level with coarsest-level cells, one or more intermediate levels with intermediate-level cells, and a finest level with finest-level cells;
obtaining a training image representative of geological patterns of said subsurface reservoir;
extracting all conditional probability distributions that can be inferred from said training image at each of said multiple grid levels;
storing said conditional probability distributions in search trees;
applying a multiple point statistic (MPS) simulation to said grid model using a hybrid path having a random path and a regular path, said MPS simulation applied from cell-to-cell at said coarsest-level cells via said regular path, at said intermediate-level cells via said random path, and at said finest-level cells via said random path until all of said cells are simulated; and
generating a facies model of said subsurface reservoir based on said cells.

2. The method of claim 1, wherein each grid has a horizontal I axis and a horizontal J axis perpendicular to said I axis and a vertical K axis, and wherein applying said MPS simulation to said grid model proceeds unidirectionally across said grid in said I axis or J axis direction and sequentially in said K axis.

3. The method of claim 1, wherein each grid has a horizontal I axis and a horizontal J axis and a vertical K axis, and wherein applying said MPS simulation to said grid model proceeds bidirectionally (back and forth) across said grid in said I axis or J axis direction and sequentially in said K axis.

4. The method of claim 1, wherein said regular path is a unilateral regular pathway.

5. The method of claim 1, wherein said regular path is a bilateral regular pathway.

6. The method of claim 1, wherein said training image is one or more 2D training images.

7. The method of claim 1, wherein said training image is one or more 3D training images.

8. The method of claim 1, wherein said training image is one or more 2D training images and one or more 3D training images.

9. The method of claim 1, wherein said training images are a conceptual representation of said subsurface reservoir.

10. The method of claim 1, wherein said training images are constructed using unconditional simulation.

11. The method of claim 1, wherein said facies model is a 2D facies model.

12. The method of claim 1, wherein said facies model is a 3D facies model.

13. The method of claim 1, wherein said facies model is two or more facies model.

14. The method of claim 1, wherein said subsurface reservoir is stationary.

15. The method of claim 1, wherein said subsurface reservoir is non-stationary with multiple regions or soft trend constraints.

16. The method of claim 1, comprising using said regular path perpendicular to a major geobody continuity direction.

17. The method of claim 1, wherein each cell is rectangular and there are more cells in a vertical axis than in any horizontal axis.

* * * * *